(12) United States Patent
Kato et al.

(10) Patent No.: US 7,637,268 B2
(45) Date of Patent: Dec. 29, 2009

(54) FILM FORMATION METHOD AND APPARATUS FOR SEMICONDUCTOR PROCESS

(75) Inventors: Hitoshi Kato, Kai (JP); Kazumi Kubo, Nirasaki (JP); Masahiko Kaminishi, Kai (JP)

(73) Assignee: Tokyo Electron Limited, Tokyo (JP)

( * ) Notice: Subject to any disclaimer, the term of this patent is extended or adjusted under 35 U.S.C. 154(b) by 449 days.

(21) Appl. No.: 11/454,939

(22) Filed: Jun. 19, 2006

(65) Prior Publication Data

US 2006/0288935 A1 Dec. 28, 2006

(30) Foreign Application Priority Data

Jun. 22, 2005 (JP) ............................. 2005-182384

(51) Int. Cl.
*C25F 1/00* (2006.01)
*C25F 3/00* (2006.01)
*C25F 5/00* (2006.01)

(52) U.S. Cl. ..................... 134/1.1; 438/706; 438/714; 438/723

(58) Field of Classification Search .................. None
See application file for complete search history.

(56) References Cited

U.S. PATENT DOCUMENTS 5,028,560 A * 7/1991 Tsukamoto et al. ......... 438/482
5,407,867 A * 4/1995 Iwasaki et al. .............. 438/694
6,309,458 B1 * 10/2001 Habuka et al. ................ 117/93
2001/0055738 A1   12/2001 Takahashi et al.
2004/0043544 A1 *  3/2004 Asai et al. .................... 438/149

FOREIGN PATENT DOCUMENTS

| JP | 64-50426 | 2/1989 |
| JP | 5-217968 | 8/1993 |
| WO | WO2004/095569 | 11/2004 |

* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

In a film formation method for a semiconductor process, a target substrate having a target surface with a natural oxide film is loaded into a reaction chamber, while setting the reaction chamber at a load temperature lower than a threshold temperature at which the natural oxide film starts being stabilized. Then, the natural oxide film is removed by etching, while supplying an etching gas containing chlorine without containing fluorine, and setting the reaction chamber at an etching pressure and an etching temperature lower than the threshold temperature. Then, the reaction chamber is purged. Then, a thin film is formed on the target surface by CVD, while supplying a film formation gas, and setting the reaction chamber at a film formation temperature.

10 Claims, 4 Drawing Sheets

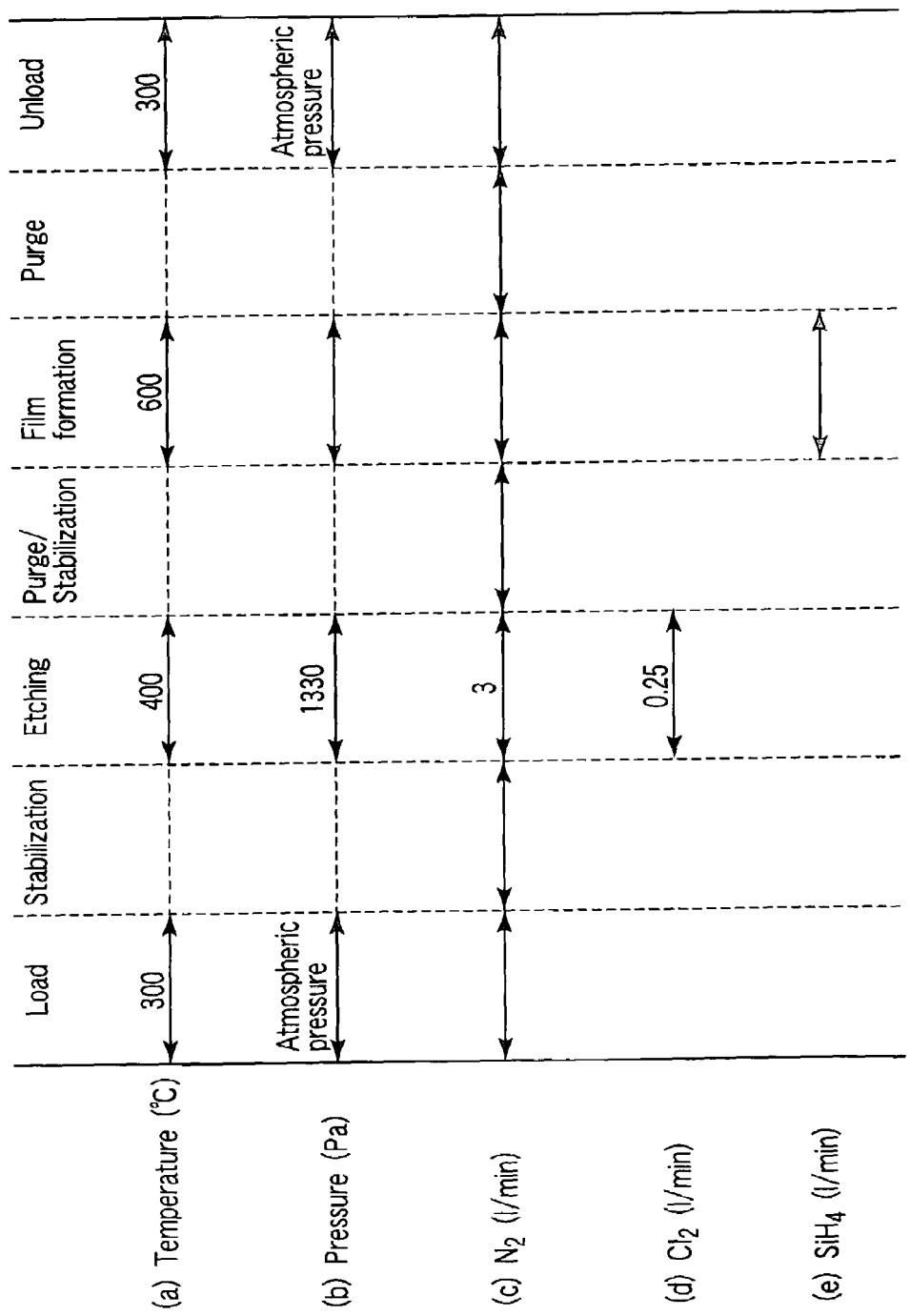
F I G. 3

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Application No. 2005-182384, filed Jun. 22, 2005, the entire contents of which are incorporated herein by reference.

BACKGROUND OF THE INVENTION

1. Field of the Invention

The present invention relates to a film formation method and apparatus for a semiconductor process for forming a thin film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, various processes, such as CVD (Chemical Vapor Deposition), are performed to form thin films on a target substrate, such as a semiconductor wafer. In film formation processes of this kind, a natural oxide film may be present on a target surface (an under-layer surface), such as the surface of, e.g., a semiconductor wafer or poly-crystalline silicon film. Accordingly, it is necessary to remove the natural oxide film prior to the film formation.

There have been various proposed methods for removing natural oxide films. For example, Jpn. Pat. Appln. KOKAI Publication No. 5-217968 (Patent Document 1) discloses the following processing method. Specifically, a semiconductor wafer is loaded into a reaction chamber, and hydrogen fluoride gas is supplied to remove a natural oxide film. Then, chlorine fluoride gas is supplied while irradiation with ultraviolet rays is used to perform etching. Further, hydrogen gas is supplied while irradiation with ultraviolet rays is used to remove chloride.

However, where the method of Patent Document 1 is used, components of a reaction chamber, such as quartz, may be etched by hydrogen fluoride gas supplied into the reaction chamber. Further, this etching produces water and oxygen, which may generate a natural oxide film and thus make it difficult to obtain a state in which no natural oxide film is present.

In order to remove a natural oxide film while preventing quartz of a reaction chamber from being etched, a method may be adopted of performing wet cleaning of semiconductor wafers outside the reaction chamber. However, where such wet cleaning is used to remove a natural oxide film from semiconductor wafers, another natural oxide film may be formed while the semiconductor wafers are transferred into the reaction chamber. Further, oxygen, moisture, or organic substances may be carried into the reaction chamber at this time and generate a natural oxide film.

BRIEF SUMMARY OF THE INVENTION

An object of the present invention is to provide a film formation method and apparatus for a semiconductor process that can reliably remove a natural oxide film and perform film formation on a target substrate.

According to a first aspect of the present invention, there is provided a film formation method for a semiconductor process, comprising:

loading a target substrate, which has a target surface with a natural oxide film formed thereon, into a reaction chamber, while setting an interior of the reaction chamber at a load temperature lower than a threshold temperature at which the natural oxide film starts being stabilized;

then, removing the natural oxide film on the target surface by etching, while supplying an etching gas, which contains chlorine without containing fluorine, into the reaction chamber, and setting the interior of the reaction chamber at an etching pressure and an etching temperature lower than the threshold temperature;

then, purging the interior of the reaction chamber; and then, forming a thin film on the target surface by CVD within the reaction chamber, while supplying a film formation gas into the reaction chamber, and setting the interior of the reaction chamber at a film formation temperature.

According to a second aspect of the present invention, there is provided a film formation apparatus for a semiconductor process, comprising:

a reaction chamber configured to accommodate a target substrate;

a mechanism configured to load/unload the target substrate to and from the reaction chamber;

a heater configured to heat an interior of the reaction chamber;

an exhaust system configured to exhaust the interior of the reaction chamber;

a film formation gas supply circuit configured to supply a film formation gas, for forming a thin film on the target substrate, into the reaction chamber;

an etching gas supply circuit configured to supply an etching gas, containing chlorine without containing fluorine, into the reaction chamber; and a control section configured to control an operation of the apparatus, wherein the control section executes loading a target substrate, which has a target surface with a natural oxide film formed thereon, into the reaction chamber, while setting the interior of the reaction chamber at a load temperature lower than a threshold temperature at which the natural oxide film starts being stabilized;

then, removing the natural oxide film on the target surface by etching, while supplying the etching gas into the reaction chamber, and setting the interior of the reaction chamber at an etching pressure and an etching temperature lower than the threshold temperature;

then, purging the interior of the reaction chamber; and then, forming a thin film on the target surface by CVD within the reaction chamber, while supplying the film formation gas into the reaction chamber, and setting the interior of the reaction chamber at a film formation temperature.

According to a third aspect of the present invention, there is provided a computer readable medium containing program instructions for execution on a processor, which, when executed by the processor, cause a film formation apparatus for a semiconductor process to execute loading a target substrate, which has a target surface with a natural oxide film formed thereon, into a reaction chamber, while setting an interior of the reaction chamber at a load temperature lower than a threshold temperature at which the natural oxide film starts being stabilized;

then, removing the natural oxide film on the target surface by etching, while supplying an etching gas, which contains chlorine without containing fluorine, into the reaction chamber, and setting the interior of the reaction chamber at an etching pressure and an etching temperature lower than the threshold temperature;

then, purging the interior of the reaction chamber; and then, forming a thin film on the target surface by CVD within the reaction chamber, while supplying a film formation gas into the reaction chamber, and setting the interior of the reaction chamber at a film formation temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a view showing the recipe of a film formation process according to a first embodiment of the present invention.

DETAILED DESCRIPTION OF THE INVENTION

Figure 1:
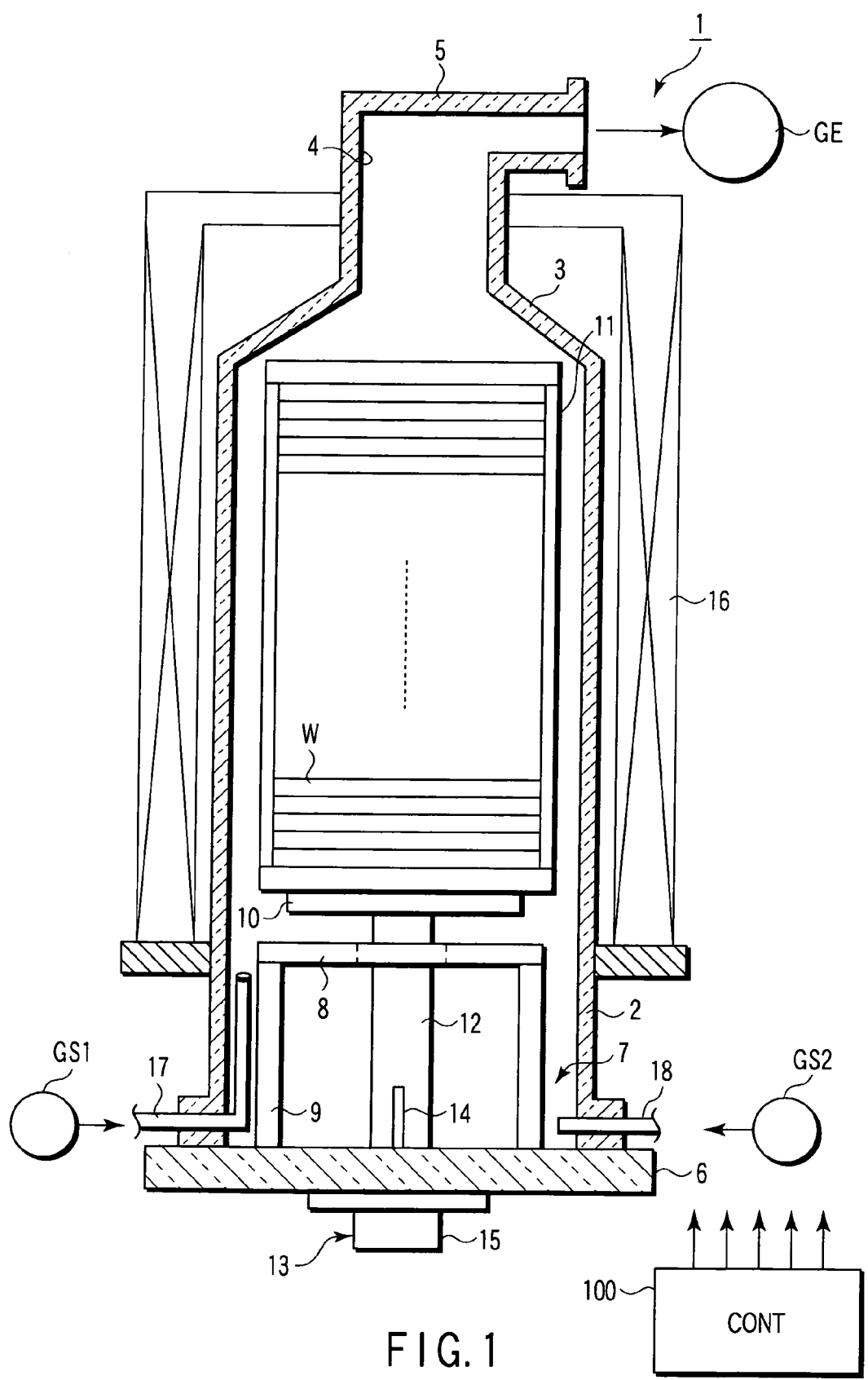
FIG. 1 is a view showing a vertical heat processing apparatus according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIG. 1 is a view showing a vertical heat processing apparatus according to a first embodiment of the present invention. This apparatus is configured as a vertical heat processing apparatus 1 of the batch type to form a poly-crystalline silicon film. As shown in FIG. 1, the heat processing apparatus 1 includes an essentially cylindrical reaction tube (reaction chamber) 2 whose longitudinal direction is set in the vertical direction. The reaction tube 2 comprises, as the main component (more than 50%), a material selected from the group consisting of heat-resistant and corrosion-resistant materials, such as quartz and silicon carbide (SiC).

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump (not shown in FIG. 1, but shown in FIG. 2 with a reference symbol 127). The exhaust section GE is used to exhaust the atmosphere within the reaction tube 2, and set it at a predetermined pressure (vacuum level).

A lid 6 is disposed below the reaction tube 2. The lid 6 comprises, as the main component (more than 50%), a material selected from the group consisting of heat-resistant and corrosion-resistant materials, such as quartz and silicon carbide (SiC). The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermal insulation cylinder 7 is disposed on the lid 6. The thermal insulation cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermal insulation cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of, e.g., 100, semiconductor wafers W at predetermined intervals in the vertical direction. The wafer boat 11 comprises, as the main component (more than 50%), a material selected from the group consisting of heat-resistant and corrosion-resistant materials, such as quartz and silicon carbide (SiC). Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as a film formation gas and an etching gas) into the reaction tube 2. Each process gas feed line 17 is connected to a process gas supply source GS1 through a mass-flow controller (MFC) described later (not shown in FIG. 1, but shown in FIG. 2 with a reference symbol 125).

The film formation gas comprises a silane family gas for forming a poly-crystalline silicon film on semiconductor wafers W by CVD. The etching gas comprises a gas containing chlorine without containing fluorine for removing a natural oxide film. In this embodiment, the film formation gas is a mixture gas of monosilane ($SiH_4$) gas used as a silane family gas with nitrogen gas used as a dilution gas. The etching gas is a mixture gas of chlorine ($Cl_2$) gas with nitrogen gas used as a dilution gas.

Although FIG. 1 shows only one process gas feed line 17, a plurality of process gas feed lines 17 are disposed in accordance with the type of process steps or the type of gases to be supplied into the reaction tube 2, in this embodiment. Specifically, a film formation gas feed line for supplying the film formation gas into the reaction tube 2 and an etching gas feed line for supplying the etching gas into the reaction tube 2 penetrate the sidewall of the reaction tube 2 near the bottom.

A purge gas feed line 18 also penetrates the sidewall of the reaction tube 2 near the bottom. The purge gas feed line 18 is connected to a purge gas supply source GS2 through a mass-flow controller (MFC) described later (not shown in FIG. 1, but shown in FIG. 2 with a reference symbol 125).

Figure 2:
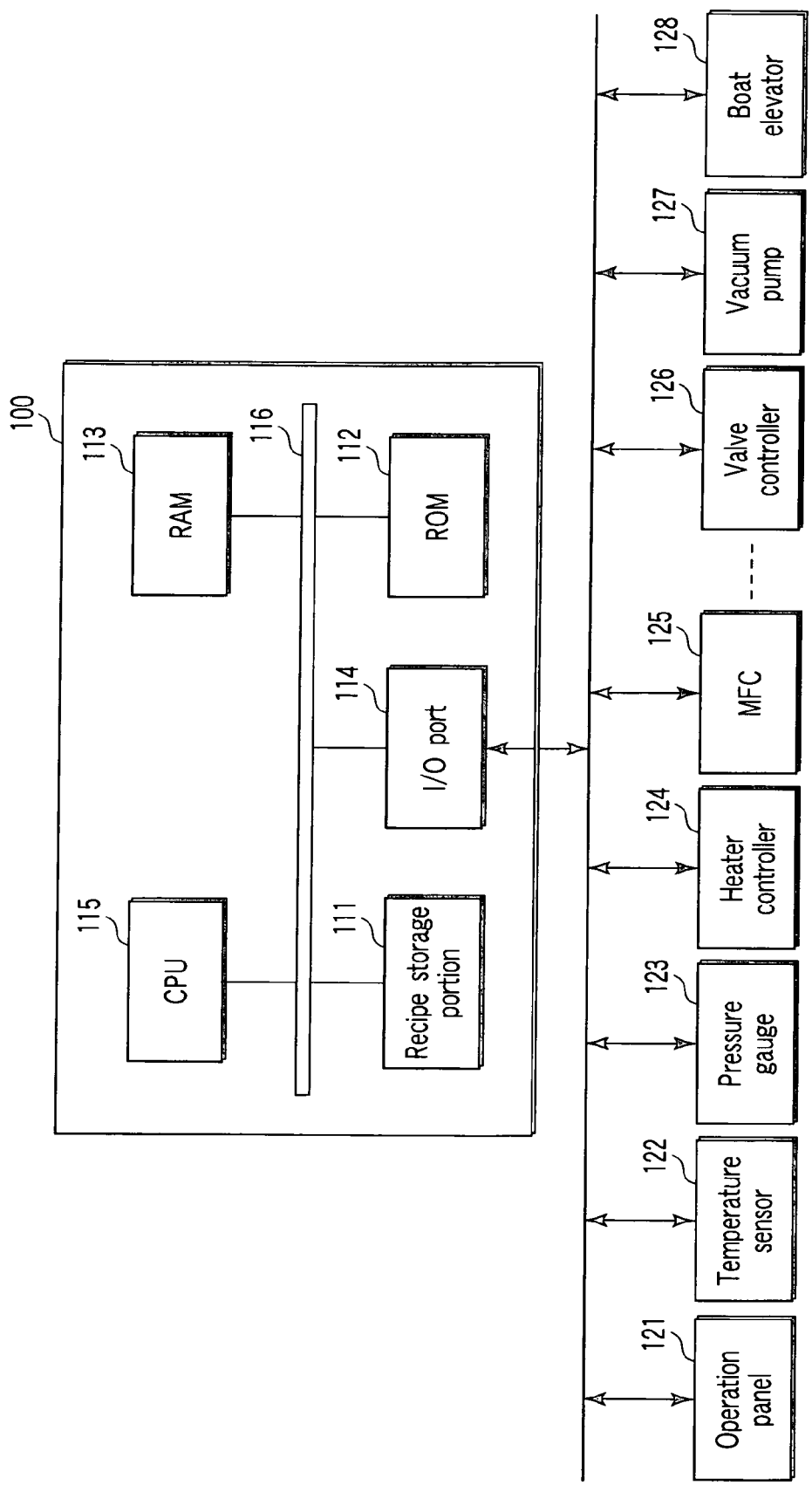
FIG. 2 is a view showing the structure of the control section of the apparatus shown in FIG. 1.

The heat processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to respectively control the heater 8 and heater 16. The heater controller 124 turns on the heater 8 and heater 16 to generate heat, in accordance with instructions from the control section 100. The heater controller 124 is also configured to measure the power consumption of the heater 8 and heater 16, and transmit this information to the control section 100.

The MFCs 125 are respectively disposed on piping lines, such as the process gas feed lines 17 and purge gas feed line 18. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and are configured to control the opening rate of valves disposed on piping lines, in accordance with instructed values received from the control section 100. The vacuum pump 127 is connected to the exhaust line 5 and is configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat processing apparatus 1 is manufactured, only the setup recipe is initially stored. The setup recipe is executed when a thermal model or the like for a specific heat processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control the operations of the heat processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a method for forming a poly-crystalline silicon film in the heat processing apparatus 1 described above. Specifically, in this embodiment, at first, semiconductor wafers (mono-crystalline silicon wafers) W with a natural oxide film formed thereon are loaded into a reaction tube 2 set at a low temperature. Then, the etching gas is supplied into the reaction tube 2 to remove the natural oxide film from the semiconductor wafers W by etching. Then, the film formation gas is supplied into the reaction tube 2 to form a poly-crystalline silicon film on the semiconductor wafers W by CVD. FIG. 3 is a view showing the recipe of a film formation process according to a first embodiment of the present invention.

The respective components of the heat processing apparatus 1 described below are operated under the control of the control section 100 (CPU 115). The temperature and pressure inside the reaction tube 2 and the gas flow rates during the processes are set in accordance with the recipe described below, while the control section 100 (CPU 115) controls the heater controller 124 (for the heaters 8 and 16), MFCs 125 (on the process gas feed lines 17 and purge gas feed line 18), valve controllers 126, and vacuum pump 127, as described above.

Specifically, at first, the interior of the reaction tube 2 is heated by the heater 16 to a predetermined load temperature, such as 300° C. Further, nitrogen ($N_2$) is supplied through the purge gas feed line 18 into the reaction tube 2 at a predetermined flow rate. Then, a wafer boat 11 that holds semiconductor wafers (silicon wafers) W is placed on the lid 6, and the lid 6 is moved up by the boat elevator 128. As a consequence, the wafer boat 11 with the semiconductor wafers W supported thereon is loaded into the reaction tube 2 and the reaction tube 2 is airtightly closed (load step).

The load temperature is set to be sufficiently lower than a temperature (500° C.) at which the natural oxide film on a silicon surface starts being reformed and stabilized by a thermal effect. Accordingly the load temperature is preferably set to be within a range of from a room temperature to 300° C.

Then, nitrogen is supplied through the purge gas feed line 18 into the reaction tube 2 at a predetermined flow rate. Further, the interior of the reaction tube 2 is heated by the heater 16 to a predetermined etching temperature, such as 400° C. Furthermore, gas inside the reaction tube 2 is exhausted to set the interior of the reaction tube 2 at a predetermined etching pressure, such as 1,330 Pa (10 Torr). The pressure reduction and heating operations are performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, an etching gas formed of a mixture gas of chlorine ($Cl_2$) gas with nitrogen gas is supplied through the corresponding process gas feed line 17 into the reaction tube 2. In this embodiment, chlorine gas is supplied at a predetermined flow rate, such as 0.25 liters/min, as shown in FIG. 3, (*d*), and nitrogen gas is supplied at a predetermined flow rate, such as 3 liters/min, as shown in FIG. 3, (*c*). Under these conditions, the surface of the semiconductor wafers W is etched to remove the natural oxide film (etching step).

The etching temperature is set to be lower than a temperature (500° C.) at which the natural oxide film on a silicon surface starts being reformed and stabilized by a thermal effect. Further, in this embodiment, the etching temperature is set to activate chlorine contained in the etching gas. Accordingly the etching temperature is preferably set to be within a range of 350 to 500° C. However, as described later, where an exciting mechanism disposed outside the reaction tube 2 is used to activate chlorine contained in the etching gas, the etching temperature may be set to be less than 350° C.

Further, in order to obtain good etching characteristics, the etching step employs other conditions, as follows. Specifically, the pressure inside the reaction tube 2 is preferably set to be within a range of 133 Pa to 26.6 kPa (1 to 200 Torr). The flow rate of chlorine is preferably set to be within a range of 0.05 to 1 liter/min. The flow rate of nitrogen is preferably set to be within a range of 0.6 to 3 liters/min. The flow rate ratio between chlorine and nitrogen is preferably set to be within a range of 1:1 to 1:12.

The etching gas supplied into the reaction tube 2 causes a thermal decomposition reaction, using heat inside the reaction tube 2, thereby generating chlorine radicals. Further, chlorine molecules are also activated by the heat. With chlorine thus activated, the surface of the semiconductor wafers W is etched, and the natural oxide film is thereby removed. At this time, the temperature inside the reaction tube 2 is set to be lower than a temperature (500° C.) at which the natural oxide film starts being reformed and stabilized. Accordingly, the natural oxide film is in an unstable state, and thus can be easily removed by etching. In other words, the natural oxide film is removed from the semiconductor wafers W before the natural oxide film has developed into a complete oxide film.

In the case of a natural oxide film present on a silicon surface, the activated chlorine penetrates this thin natural oxide film and etches the silicon surface. Further, where a surface of the semiconductor wafers W is exposed, the activated chlorine etches the exposed surface. When a surface of the semiconductor wafers W is etched, a natural oxide film on the surface thus etched is removed from the semiconductor wafers W. Consequently, the surface of the semiconductor wafers W is uniformly etched along with the natural oxide film.

Further, the activated chlorine used for removing the natural oxide film can hardly etch quartz or silicon carbide. Accordingly, components inside the reaction tube 2 are less damaged during the etching step. Furthermore, since no water or oxygen is generated during the etching, there is no fear that a natural oxide film is regenerated on the semiconductor wafers W after the original natural oxide film is removed. In addition, metal components inside the reaction tube 2 are prevented from suffering rust generation due to water.

When the natural oxide film on the surface of the semiconductor wafers W is removed, the supply of the etching gas through the process gas feed line 17 is stopped. Then, the interior of the reaction tube 2 is exhausted, and nitrogen is supplied through the purge gas feed line 18 at a predetermined flow rate, as shown in FIG. 3, (*c*), so that the gas inside the reaction tube 2 is exhausted to the exhaust line 5 (purge step). It is preferable to perform a cycle purge, i.e., to repeat the gas exhaust and nitrogen gas supply for the interior of the process tube 2 a plurality of times, in order to reliably exhaust the gas inside the process tube 2.

Then, nitrogen is supplied through the purge gas feed line 18 into the reaction tube 2 at a predetermined flow rate. Further, the interior of the reaction tube 2 is heated by the heater 16 to a predetermined film formation temperature, such as 600° C. Furthermore, gas inside the reaction tube 2 is exhausted to set the interior of the reaction tube 2 at a predetermined pressure, such as 26.6 Pa (0.2 Torr). The pressure reduction and heating operations are performed until the reaction tube 2 is stabilized at the predetermined pressure and temperature (stabilization step).

The motor of the rotation mechanism 13 is controlled to rotate the wafer boat 11 through the rotary table 10. The wafer boat 11 is rotated along with the semiconductor wafers W supported thereon, thereby uniformly heating the semiconductor wafers W.

When the interior of the reaction tube 2 is stabilized at the predetermined pressure and temperature, the supply of nitrogen through the purge gas feed line 18 is stopped. Then, a film formation gas formed of a mixture gas of monosilane ($SiH_4$) gas with nitrogen gas is supplied through the corresponding process gas feed line 17 into the reaction tube 2, as shown in FIGS. 3, (*c*) and (*e*).

The film formation gas supplied into the reaction tube 2 causes a thermal decomposition reaction, using heat inside the reaction tube 2. The decomposition components produce silicon molecules and atoms, from which a poly-crystalline silicon film is formed on the surface of the semiconductor wafers W (film formation step). Since the film formation step is performed subsequently to the etching step within the same reaction tube 2, the poly-crystalline silicon film is formed on the semiconductor wafers W with no natural oxide film deposited thereon.

When the poly-crystalline silicon film formed on the surface of the semiconductor wafers W reaches a predetermined thickness, the supply of the film formation gas through the process gas feed line 17 is stopped. Then, the interior of the reaction tube 2 is exhausted, and nitrogen is supplied through the purge gas feed line 18 at a predetermined flow rate, as shown in FIG. 3, (c), so that the gas inside the reaction tube 2 is exhausted to the exhaust line 5 (purge step). It is preferable to perform a cycle purge, i.e., to repeat the gas exhaust and nitrogen gas supply for the interior of the process tube 2 a plurality of times, in order to reliably exhaust the gas inside the process tube 2.

Then, nitrogen is supplied through the purge gas feed line 18 into the reaction tube 2 at a predetermined flow rate, as shown in FIG. 3, (b), so that the pressure inside the process tube 2 is returned to atmospheric pressure. Then, the lid 6 is moved down by the boat elevator 128, and the wafer boat 11 is thereby unloaded along with the wafers W having the poly-crystalline silicon film formed thereon (unload step).

Second Embodiment

Figure 4:
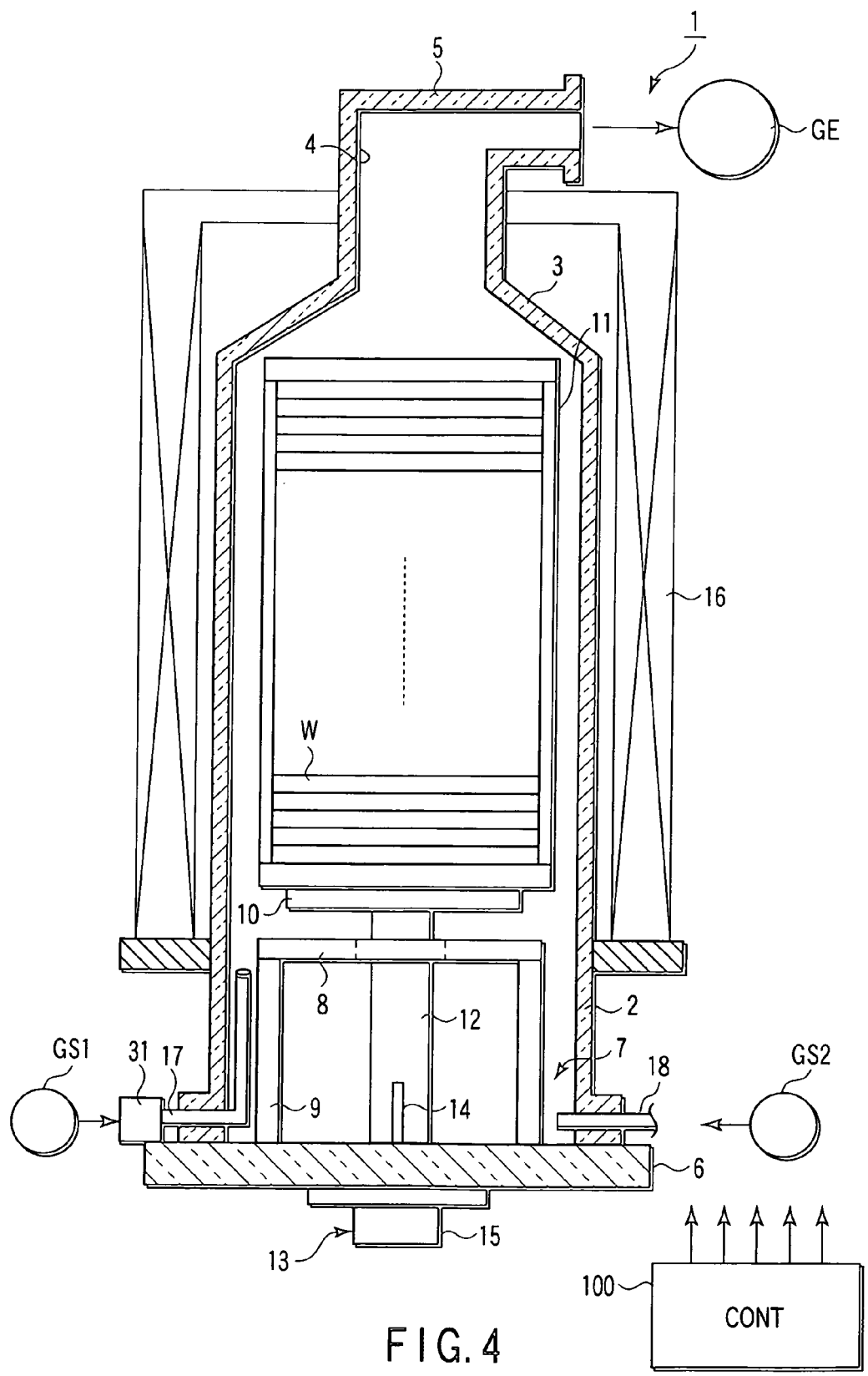
FIG. 4 is a view showing a vertical heat processing apparatus according to a second embodiment of the present invention.

FIG. 4 is a view showing a vertical heat processing apparatus according to a second embodiment of the present invention. This apparatus 1X has the same structure as the heat processing apparatus 1 described above, except that a process gas feed line 17 is provided with an exciting mechanism 31. In this film formation apparatus 1X, when an etching gas is supplied from the process gas supply source GS1 and flows through the exciting mechanism 31, chlorine contained in the etching gas is activated. In this case, even where the temperature inside the reaction tube 2 is set to be lower than the former case during the etching step, activated chlorine can be supplied onto the semiconductor wafers W. Accordingly, it is possible to use a lower process temperature for the etching step. The exciting mechanism 31 may be arranged to activate chlorine by means of plasma, ultraviolet rays, or a catalyst.

In the embodiments described above, the etching gas is formed of a mixture gas of chlorine ($Cl_2$) gas with nitrogen gas. In this respect, the etching gas may be another gas (containing chlorine without containing fluorine), such as a mixture gas of hydrogen chloride gas with nitrogen gas.

In the embodiments described above, the film formation gas is formed of a mixture gas of monosilane ($SiH_4$) gas used as a silane family gas with nitrogen gas. In this respect, the silane family gas may be another gas, such as dichlorosilane (DCS), disilane ($Si_2H_6$), trisilane ($Si_3H_8$), hexachlorodisilane ($Si_2Cl_6$: HCD), hexamethyldisilazane (HMDS), tetrachlorosilane ($SiCl_4$: TCS), disilylamine (DSA), trisilylamine (TSA), and bistertialbutylaminosilane (BTBAS).

In the embodiments described above, a natural oxide film is present on semiconductor wafers W (typically, consisting of mono-crystalline silicon). In this respect, the present invention may be applied to a case where a natural oxide film is present on a semiconductor film, such as silicon (consisting of mono-crystalline or poly-crystalline silicon), or a natural oxide film is present on a metal film, such as tungsten (W). The target substrate is not limited to a semiconductor wafer W, and it may be a glass substrate for, e.g., an LCD.

For example, where a natural oxide film formed on a poly-crystalline silicon film is removed, activated chlorine (chlorine radicals) is supplied in accordance with the same sequence as that used in the embodiments described above. The activated chlorine thus supplied penetrates this thin natural oxide film and etches the surface of the poly-crystalline silicon film on which the natural oxide film is present. This is so, because activated chlorine can pass through a thin natural oxide film, and it has a high selectivity of poly-crystalline silicon and preferentially etches poly-crystalline silicon surfaces. Accordingly, with this etching, the surface of the poly-crystalline silicon film, on which the natural oxide film is present, is removed, and thus the natural oxide film present thereon is also removed. The same mechanism can be found in relation to natural oxide films formed on silicon films and metal films.

In the embodiments described above, each of the etching gas and film formation gas contains nitrogen gas as a dilution gas. Each of these gases preferably contains a dilution gas, because the process time can be more easily controlled if it is so arranged. However, the etching gas or film formation gas may contain no dilution gas. The dilution gas consists preferably of an inactive gas, such as nitrogen gas, helium gas (He), neon gas (Ne), or argon gas (Ar).

In the embodiments described above, the process gas feed lines 17 are disposed in accordance with the type of process steps. Alternatively, for example, a plurality of process gas feed lines 17 may be disposed in accordance with the type of gases. Further, a plurality of process gas feed lines 17 may be connected to the sidewall of the reaction tube 2 near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat processing apparatus employed is a heat processing apparatus of the batch type having a single-tube structure. However, for example, the present invention may be applied to a vertical heat processing apparatus of the batch type having a reaction tube of the double-tube type, which is formed of inner and outer tubes. Alternatively, the present invention may be applied to a heat processing apparatus of the single-substrate type.

The control section 100 of the heat processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a film on a plurality of target substrates each having a target surface consisting essentially of silicon with a natural oxide film formed thereon, in a reaction chamber consisting mainly of a material selected from the group consisting of quartz and silicon carbide, the method comprising:

supplying nitrogen gas into the reaction chamber and setting an interior of the reaction chamber at a load temperature of from a room temperature of 300° C., which is lower than a threshold temperature at which the natural oxide film starts being stabilized, by heating the reaction chamber by a heater surrounding the reaction chamber and made of a resistive heating body;

loading a holder that supports the target substrates at predetermined intervals in a vertical direction into the reaction chamber set at the load temperature;

stabilizing the interior of the reaction chamber that accommodates the holder and the target substrates at an etching pressure of 133 Pa to 26.6 kPa (1 to 200 Torr) and an etching temperature of 300 to 500° C., which is lower than the threshold temperature, by supplying only nitrogen gas into the reaction chamber while exhausting gas from inside the reaction chamber and heating the reaction chamber by the heater;

removing the natural oxide film on the target surface of the target substrates by etching in the reaction chamber set at the etching pressure and the etching temperature, while supplying an etching gas, which consists of chlorine gas and nitrogen gas with a flow rate of 1:1 to 1:12 between the chlorine gas and the nitrogen gas and thus contains no fluorine, into the reaction chamber, and activating chlorine in the etching gas by the heater;

purging the interior of the reaction chamber by performing a cycle purge arranged to repeat a plurality of times an operation of exhausting gas from inside the reaction chamber and an operation of supplying nitrogen gas into the reaction chamber;

stabilizing the interior of the reaction chamber that accommodates the holder and the target substrates at a film formation pressure and a film formation temperature by supplying nitrogen gas into the reaction chamber while exhausting gas from inside the reaction chamber and heating the reaction chamber by the heater; and forming a thin film on the target surface of the target substrates by CVD inside the reaction chamber set at the film formation pressure and the film formation temperature, while supplying a film formation gas into the reaction chamber.

2. The method according to claim 1, wherein the etching gas is supplied into the reaction chamber, while chlorine contained therein is being preliminarily activated outside the reaction chamber by an exciting mechanism disposed outside the reaction chamber.

3. The method according to claim 2, wherein the exciting mechanism is arranged to activate chlorine by means selected from the group consisting of plasma, ultraviolet rays, and a catalyst.

4. The method according to claim 1, wherein the target surface consists essentially of a material selected from the group consisting of mono-crystalline silicon and poly-crystalline silicon.

5. The method according to claim 1, wherein the threshold temperature is 500° C.

6. The method according to claim 1, wherein the film formation gas comprises a silicon-containing gas, and the thin film consists essentially of a silicon film.

7. The method according to claim 6, wherein the etching temperature is lower than the film formation temperature.

8. The method according to claim 1, wherein the reaction chamber has an exhaust port at a center of a top thereof, through which gas is exhausted from inside the reaction chamber.

9. The method according to claim 8, wherein the etching is performed while rotating the holder along with the target substrates about a vertical axis.

10. The method according to claim 6, wherein the silicon-containing gas is selected from the group consisting of monosilane, dichlorosilane, disilane, trisilane, hexachlorodisilane, hexamethyldisilazane, tetrachlorosilane, disilylamine, trisilylamine, and bistertialbutylaminosilane.

* * * * *